United States Patent [19]

Na

[11] Patent Number: 5,657,344

[45] Date of Patent: Aug. 12, 1997

[54] TRANSMITTING/RECEIVING SIGNAL PROCESSING CIRCUIT IN DIGITAL CORDLESS TELEPHONE

[75] Inventor: Bo-Gyu Na, Kyungki-do, Rep. of Korea

[73] Assignee: SamSung Electronics Co., Ltd., Suwo, Rep. of Korea

[21] Appl. No.: 509,700

[22] Filed: Jul. 31, 1995

[30] Foreign Application Priority Data

Aug. 3, 1994 [KR] Rep. of Korea .................. 19179/1994

[51] Int. Cl.$^6$ ............................................. H04B 1/38
[52] U.S. Cl. ..................... 375/219; 370/280; 370/294; 455/76; 455/86
[58] Field of Search ..................... 375/219, 376, 375/327; 331/2, 25; 455/76, 78, 83, 84, 86, 260; 370/278, 280, 281, 282, 294

[56] References Cited

U.S. PATENT DOCUMENTS

| | | | |
|---|---|---|---|
| 4,627,099 | 12/1986 | Shimakata | 455/76 |
| 4,800,341 | 1/1989 | Johnson | 331/2 |
| 4,862,107 | 8/1989 | Paneth | 331/2 |
| 5,144,254 | 9/1992 | Wilke | 331/2 |
| 5,163,160 | 11/1992 | Foucher et al. | 455/76 |
| 5,276,913 | 1/1994 | Lee et al. | 455/76 |
| 5,309,429 | 5/1994 | Fukuda | 370/29 |
| 5,317,284 | 5/1994 | Yang | 331/2 |
| 5,408,201 | 4/1995 | Uriya | 331/2 |
| 5,422,604 | 6/1995 | Jokura | 331/2 |
| 5,423,075 | 6/1995 | Boese et al. | 455/86 |
| 5,423,076 | 6/1995 | Westergren et al. | 455/86 |
| 5,515,364 | 5/1996 | Fague | 455/260 |

FOREIGN PATENT DOCUMENTS

| | | |
|---|---|---|
| 0 496 498 A2 | 7/1992 | European Pat. Off. . |
| WO93/11613 | 6/1993 | WIPO . |
| WO93/14573 | 7/1993 | WIPO . |

Primary Examiner—Temesghen Ghebretinsae
Attorney, Agent, or Firm—Robert E. Bushnell, Esq.

[57] ABSTRACT

A transmitting/receiving signal processing circuit incorporates a frequency discrimination demodulator and a frequency synthesis local oscillator having a heterodyne phase locked loop for high speed switching. The transmitting/receiving signal processing circuit is used in a digital cordless communication device and has a transmitter for converting a signal input through a speaker and transmitting the converted signal as a radio wave via an antenna. A receiver converts a signal received by the antenna and then transmits the converted signal to a user in a time division communication system using a single frequency channel for transmission and reception according to constant time periods. A frequency synthesizer is also provided and includes a first phase lock loop for synthesizing a reference frequency for channel conversion; a switching stage providing a local oscillation signal from the receiver as a heterodyning source in a receiving mode, and providing a signal multiplied by the reference frequency as the heterodyning source in a transmission mode; and a second phase locked loop connected between the first phase locked loop and the receiver, for receiving the heterodyning source and generating transmitting/receiving frequencies in the transmission/receiving modes, respectively.

20 Claims, 3 Drawing Sheets

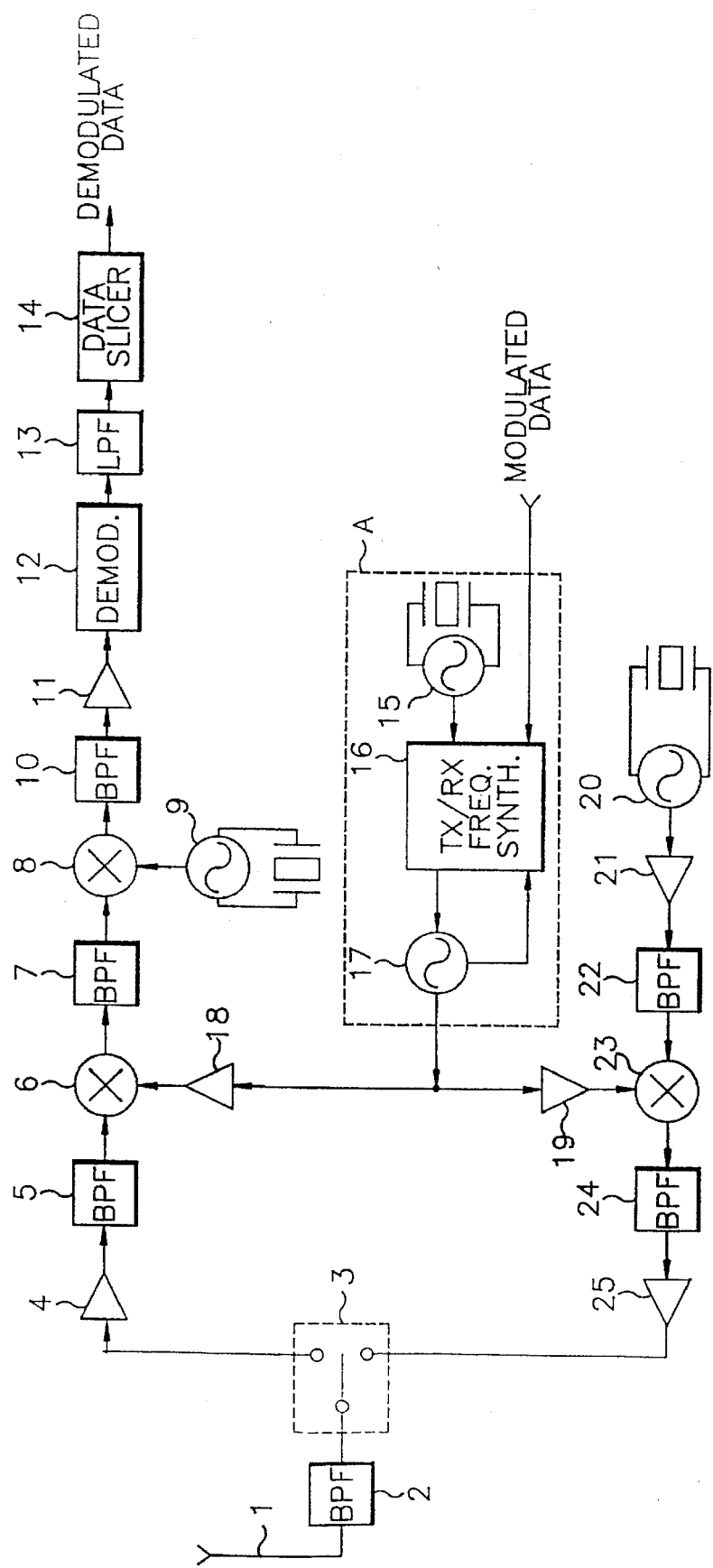
FIG. 1 CONVENTIONAL

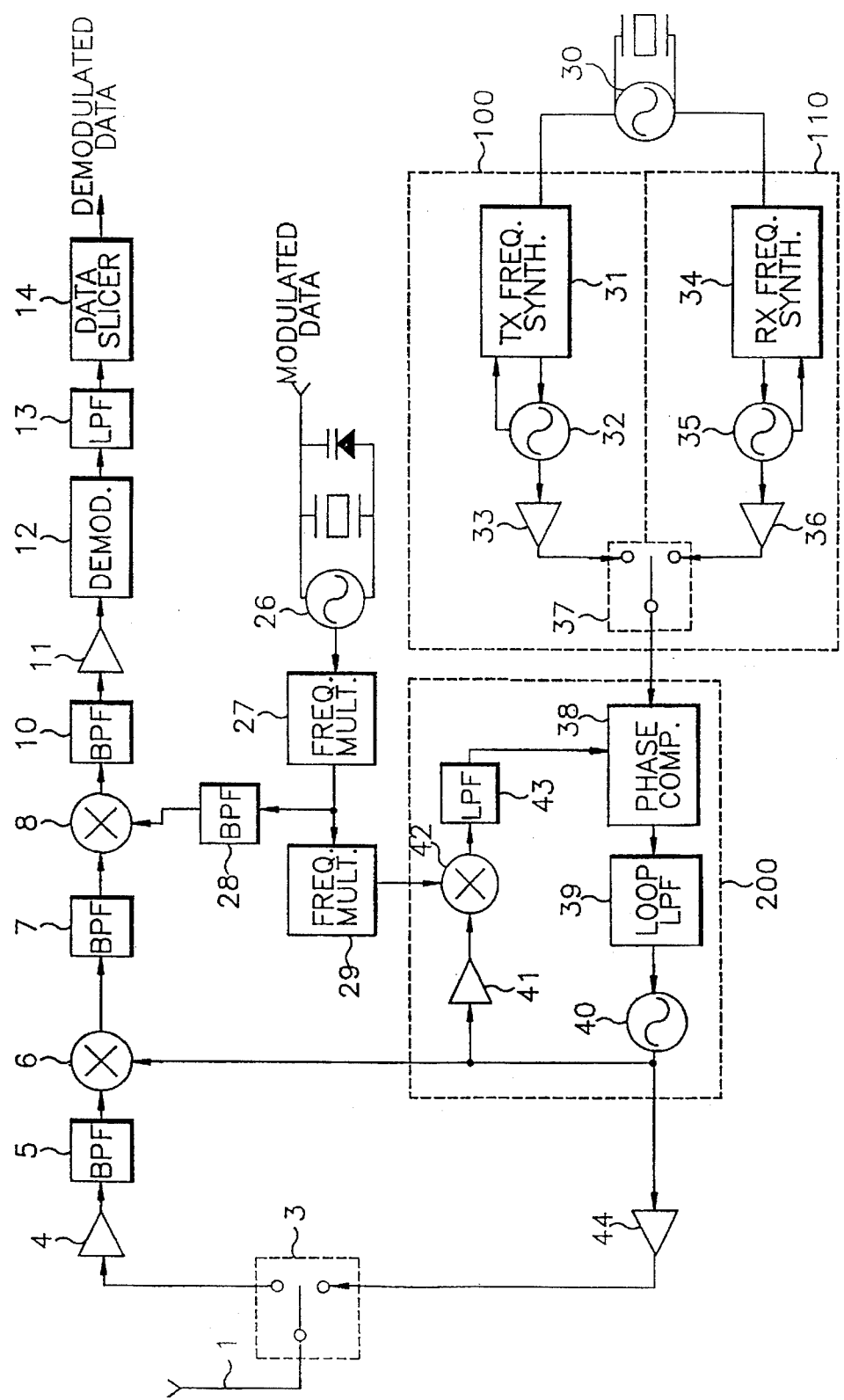
FIG. 2 CONVENTIONAL

TRANSMITTING/RECEIVING SIGNAL PROCESSING CIRCUIT IN DIGITAL CORDLESS TELEPHONE

CROSS-REFERENCE TO RELATED APPLICATIONS

This application makes reference to, incorporates the same herein, and claims all benefits accruing under 35 U.S.C. §119 from an application for TRANSMITTING/ RECEIVING SIGNAL PROCESSING CIRCUIT IN DIGITAL CORDLESS TELEPHONE filed in the Korean Industrial property Office 3 Aug. 1994 and assigned Ser. No. 19179/1994.

BACKGROUND OF THE INVENTION

The present invention relates to a transmitting/receiving signal processing circuit in a digital cordless communication device, and more particularly to a transmitting/receiving signal processing circuit which incorporates a frequency-discrimination demodulator and a frequency synthesized local oscillator comprised of a heterodyne phase locked loop (PLL) for high speed switching.

In the late 1980's and early 1990's, a second generation of digital cordless telephones (CT2) using a frequency division multiple access-time division duplexing (FDMA-TDD) method was introduced. This method has proven to be effective in the field of telecommunications.

In designing transceivers for digital cordless telephones that perform this or other methods of communication, accurate generation of frequencies for signal transmission and reception is always a key concern. Many devices employ one or more phase locked loops (PLL) in order to generate desired frequencies. One such device is disclosed in U.S. application Ser. No. 08/402,506 entitled Transceiver Signal Processor For Digital Cordless Communication Apparatus, assigned to the same assignee as the present invention.

Another device is disclosed in U.S. Pat. No. 5,423,075 entitled Combined Radio Transmission And Reception Apparatus With A PLL Circuit issued to Boese et al. on 6 Jun. 1995. In Boese et al. '075, a transceiver having a transmitting section and a receiving section is provided with a single phase locked loop (PLL) to which the two sections have alternating access. While conventional art such as Boese et al. '075 has merit in its own right, I have learned that an improved device which performs effective high speed frequency switching can be contemplated.

SUMMARY OF THE INVENTION

It is therefore an object of the present invention to provide an improved transmitting/receiving signal processing circuit.

It is another object to provide a transmitting/receiving signal processing circuit that can be implemented using commercialized, off-the-shelf components.

It is still another object to provide a transmitting/receiving signal processing circuit that provides improved power efficiency.

It is yet another object to provide a transmitting/receiving signal processing circuit that eliminates frequency drifting.

To accomplish these and other objects, a transmitting/receiving signal processing unit constructed according to the principles of the present invention is provided in a digital cordless telephone device. The transmitting/receiving signal processing unit of the present invention contemplates a transmitting unit for convening a signal input through a speaker, and transmitting the converted signal to a telephone via an antenna in a time division communication system which uses a single frequency channel for transmission and reception according to constant time periods. A receiving unit is also provided for converting a signal received in an antenna, and then transmitting the converted signal to a user. The present invention further includes a frequency synthesizer with a first phase locked loop (PLL) synthesizing a reference transmission frequency for channel conversion; a switching stage providing a local oscillation signal derived from the receiving unit as a heterodyne source in a receiving mode, and providing a signal multiplied by the reference transmission frequency as the heterodyne source in a transmission mode; and a second phase locked loop (PLL) connected between the first phase locked loop (PLL) and the receiving unit, for receiving the heterodyne sources and generating transmission/receiving frequencies in the transmission/receiving modes, respectively.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 1 is a block diagram illustrating a conventional transmitting/receiving signal processing circuit using a transmission frequency mixture conversion system in a digital cordless telephone;

FIG. 2 is a block diagram illustrating another conventional transmitting/receiving signal processing circuit using a heterodyne double phase locked loop of a transmitting/receiving frequency conversion system in a digital cordless telephone.

DETAILED DESCRIPTION OF THE REFERRED EMBODIMENTS

Figure 3:
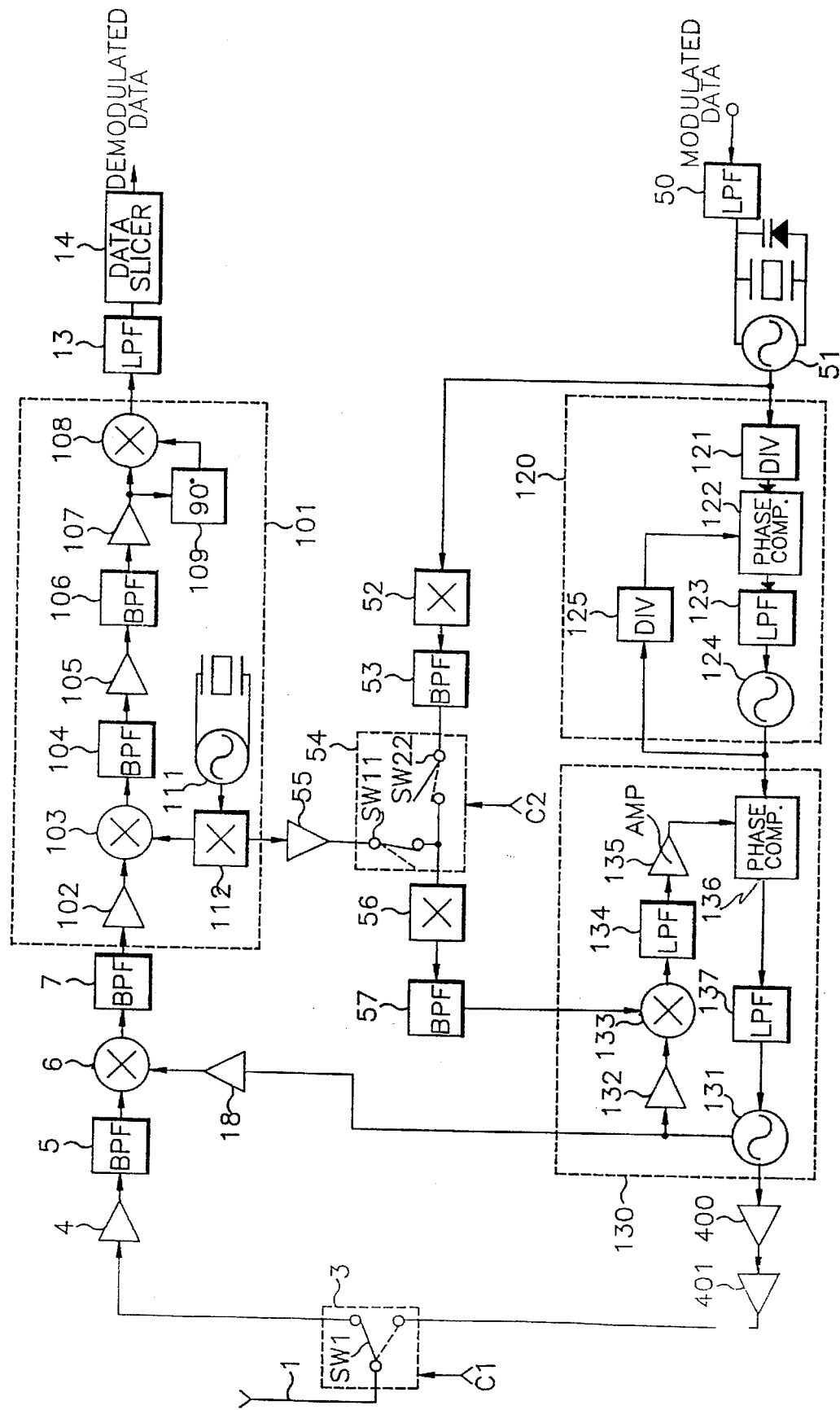
FIG. 3 is a block diagram illustrating a transmitting/receiving signal processing circuit using a frequency discriminating demodulator and a frequency synthesized local oscillator comprised of a heterodyne single phase locked loop in a digital cordless telephone constructed according to the principles of the present invention.

Turning now to the drawings and referring to FIG. 1, a block diagram of a conventional transmitting/receiving signal processing circuit using a transmission frequency mixture conversion system in a digital cordless telephone is illustrated. GPT Ltd., in England, has adopted the use of this transmitting/receiving signal processing circuit and Motorola, Inc., in the U.S.A., has adopted the use of a circuit that is similar to the circuit represented in FIG. 1.

In FIG. 1, reference numeral 1 designates an antenna, reference numeral 2 designates a bandpass filter (BPF), reference numeral 3 designates a transmitter/receiver switch, reference numeral 4 designates a low-noise receiver amplifier, reference numeral 5 designates a radio frequency bandpass filter, reference numeral 6 designates a first receiver mixer, reference numeral 7 designates a first intermediate frequency (IF) receiver bandpass filter, reference numeral 8 designates a second receiver mixer, reference numeral 9 designates a receiver local oscillator (LO), reference numeral 10 designates a second intermediate frequency (IF) receiver bandpass filter, reference numeral 11 designates an intermediate frequency (IF) amplifier, reference numeral 12 designates a demodulator, reference numeral 13 designates a low-pass filter (LPF), reference numeral 14 designates a data slicer, reference numeral 15 designates a reference frequency crystal oscillator, reference numeral 16 designates a transceiver frequency synthesizer, reference numeral 17 designates a voltage-controlled oscillator (VCO), reference numeral 18 designates a reception buffer amplifier for a reception path, reference numeral 19 designates a transmission buffer amplifier for a transmission path, reference numeral 20 designates a transmitter offset local oscillator, reference numeral 21 designates an amplifier/multiplier stage, reference numeral 22 designates a transmitter offset intermediate frequency (IF) bandpass filter, reference numeral 23 designates a transmitter mixer, reference numeral 24 designates a transmission frequency bandpass filter, and reference numeral 25 designates a transmitter power amplifier.

In the transceiver signal processing circuit shown in FIG. 1, a single phase locked loop (PLL) frequency synthesizer (A) having reference frequency crystal oscillator 15, transceiver frequency synthesizer 16 and voltage-controlled oscillator (VCO) 17 is used as a first local oscillator for both the transmitting and receiving portions of the circuit.

In the transceiver signal processing circuit shown in FIG. 1, however, the maximum phase comparing frequency of the single phase locked loop (PLL) frequency synthesizer (A) can not exceed the frequency difference between channels, with the loop bandwidth being much smaller than that (generally one tenth or below). Accordingly, the locking (stabilizing) time of the loop is rather long since it is inversely proportional to the loop bandwidth. That is to say, since a locking time much greater than the guard time (i.e., the delay time between an FDMA-TDD transmit frame and receive frame) is required, undesirable frequency transients occurring due to load fluctuations between transmission and receiving states cannot be restored (for their subsequent removal) within the guard time. Therefore, the burden placed on buffering amplifiers 18 and 19, which are utilized to improve the isolation performance between the load and oscillator, increases. Accordingly, this arrangement is not suitable for high-frequency circuits and results in lower efficiency.

Since frequency switching is impossible due to the foregoing problems, transmitter mixer 23 mixes the output frequency of second transmitter local oscillator 20 with the transmitter intermediate frequency during transmission to output the required frequency signal. During this process, due to the signal loss in transmitter mixer 23, the gain of transmitter power amplifier 25 should be large. Therefore, power consumption becomes large when a multi-stage transmitter power amplifier is used.

Also, since the output of transmitter mixer 23 includes many harmonics and intermodulation components, multistage bandpass filter 24 has high signal loss which causes design problems.

The burden of high-frequency circuitry due to the foregoing problems lowers the integration efficiency of semiconductor circuits and worsens productivity. Furthermore, it is difficult to reduce chip size and cost.

Referring now to FIG. 2, another conventional transceiver signal processing circuit which uses a double phase locked loop (PLL) method for synthesizing the heterodyned transmitter/receiver frequencies in a digital cordless telephone is shown. In FIG. 2, like elements are designated by the same reference numerals as in FIG. 1, and descriptions of these elements will therefore be omitted.

In FIG. 2, reference numeral 26 designates a voltage-varied crystal oscillator, reference numeral 27 designates a first frequency multiplier, reference numeral 28 designates a bandpass filter, reference numeral 29 designates a second frequency multiplier, reference numeral 30 designates a reference frequency crystal oscillator, reference numeral 100 designates a transmitter phase locked loop (PLL), reference numeral 110 designates a receiver phase locked loop (PLL), and reference numeral 200 designates a heterodyning phase locked loop (PLL) for high-speed switching between transmitter and receiver frequencies. Transmitter phase locked loop (PLL) 100 includes a transmitter frequency synthesizer 31, a transmitter voltage-controlled oscillator (VCO) 32, and a buffering amplifier 33. Receiver phase locked loop (PLL) 110 includes a receiver frequency synthesizer 34, a receiver voltage-controlled oscillator (VCO) 35, and a receiver frequency amplifier 36. Heterodyning phase locked loop (PLL) 200 includes: a phase comparator 38, a loop low-pass filter 39, a transceiver voltage-controlled oscillator (VCO) 40, a buffering amplifier 41, a frequency mixer 42, and a low-pass filter 43. Reference numeral 37 designates another transmitter/receiver switch, and reference numeral 44 designates a buffering amplifier.

Since the above heterodyning phase-locked loop (PLL) transceiver uses a frequency discrimination method, in which a frequency is demodulated in demodulator 12 by multiplying a second intermediate frequency (IF) (which can not be 0 Hz) with the second intermediate frequency (IF) phase-shifted by 90 degrees, the offset corresponding to the second intermediate frequency (IF) of the receiver is generated at the required transmitter frequency.

During this time, if the offset is set to 0 Hz, since the signal obtained by multiplying the output signal of voltage-varied crystal oscillator 26 in first frequency multiplier 27 coincides with a first intermediate frequency (IF) of the receiver, which is a weak frequency component, the reception sensitivity is destroyed. Accordingly, it is impossible to set the actual offset to 0 Hz.

Therefore, the transceiver signal processing circuit of FIG. 2 is provided with a separate transmitter phase locked loop (PLL) 100 and receiver phase locked loop (PLL) 110. Frequency signals are provided to heterodyning phase locked loop (PLL) 200 via transmitter/receiver switch 37. During this time, since the two frequency signals are alternately selected by transmitter/receiver switch 37, the same problems as those in the transceiver signal processing circuit of FIG. 1 exist.

Also, since two phase locked loops (PLL) are used, the circuit is complex, and the frequency division rate data of transmitting and receiving channels should be input separately. Moreover, since two frequencies are generated with a spacing equal to the second intermediate frequency (IF) frequency, the transmitter voltage-controlled oscillator (VCO) 32 and receiver voltage-controlled oscillator (VCO) 35 are likely to beat with each other.

Referring now to FIG. 3, a block diagram of a transmitting/receiving signal processing circuit using a frequency discrimination demodulator and a frequency synthesis local oscillator comprised of a heterodyne single phase locked loop (PLL) in a digital cordless telephone constructed according to the principles of the present invention is illustrated.

The elements shown in FIG. 3 may be adopted as a radio frequency (RF) unit, since a digital cordless communication device is divided into a radio frequency (RF) unit and a baseband unit. The transmitting/receiving signal processing circuit of FIG. 3 includes a frequency discriminating demodulator block 101, a first phase locked loop (PLL) 120, a second phase locked loop (PLL) 130, and a switching circuit 54. FIG. 3 further includes an antenna 1, a transmitter/receiver switch 3, a low noise amplifier 4, a band pass filter (BPF) 5, a first receiver mixer 6, a band pass filter (BPF) 7, a low pass filter (LPF) 13, a data slicer 14, a receiver buffer amplifier 18, a low pass filter (LPF) 50, a reference frequency quartz-crystal oscillator 51, a frequency multiplier 52, a band pass filter (BPF) 53, an amplifier 55, a frequency multiplier 56, a band pass filter (BPF) 57, and first and second power amplifiers 400 and 401, respectively.

Frequency discriminating demodulator block 101 includes a first intermediate frequency (IF) amplifier 102, a second intermediate frequency (IF) mixer 103, band pass filters (BPFs) 104 and 106, second intermediate frequency (IF) amplifiers 105 and 107, a multiplier 108, a phase shifter 109, a receiver local oscillator 111, and a frequency multiplier 112.

First phase locked loop (PLL) 120 for converting a channel includes frequency dividers 121 and 125, a phase comparator 122, a low pass filter (LPF) 123, and a voltage-controlled oscillator 124.

Second phase locked loop (PLL) 130 for switching a transmitting/receiving frequency at a high speed includes a phase comparator 136, a low pass filter (LPF) 137, a voltage-controlled ocsillator (VCO) 131, an isolation buffer 132, a mixer 133, a low pass filter (LPF) 134, and an amplifier 135.

Transmitting/receiving switch 3 and switching circuit 54 receive switching control signals C1 and C2 from the baseband unit (not shown), respectively.

In a transmission mode, SW1 of transmitting/receiving switch 3 is connected to second power amplifier 401 in response to a state of switching control signal C1, while SW22 and SW11 of switching circuit 54 are closed and opened, respectively, in response to a state of switching control signal C2.

In a receiving mode, SW1 of transmitting/receiving switch 3 is connected to low noise amplifier 4 to provide a radio frequency (RF) signal from antenna 1. Also during the receiving mode, SW22 and SW11 of switching circuit 54 are opened and closed, respectively.

Accordingly, the output frequency of frequency multiplier 112 received through amplifier 55 is utilized as a heterodyne source of second phase locked loop (PLL) 130 during the receiving mode, thereby simplifying the construction of the radio frequency (RF) unit.

An explanation of the operations of the transmitting/receiving signal processing circuit of FIG. 3 will now be given.

Generally, in a frequency division multiple access and time-division duplex (FDMA-TDD) system providing bilateral communication, the receiver uses a heterodyne system and the transmitter uses an alternating current signaling system in order to generate proper frequencies for transmission and reception modes. The reception and transmission modes are alternately repeated in accordance with a predetermined time period and a given guard time, thereby requiring that the frequency of signals transmitted from voltage-controlled oscillator (VCO) 131 be adjusted to necessary levels for both the reception and transmission modes. In other words, voltage-controlled oscillator (VCO) 131 generates a first frequency for the reception mode and a second frequency for the transmission mode. Accordingly, second phase locked loop (PLL) 130 comprised of voltage-controlled oscillator (VCO) 131 must be capable of being switched at a high speed in order to stabilize the frequency switching operation within a given short guard time.

In the present invention, second phase locked loop (PLL) 130 comprised of phase comparator 136, low pass filter (LPF) 137, voltage-controlled oscillator (VCO) 131, buffer 132, mixer 133, low pass filter (LPF) 134, and amplifier 135 is capable of quickly and effectively switching between transmission and reception mode frequencies. A necessary minimum frequency should be set since a locking time of second phase-locked loop (PLL) 130 is proportional to a reciprocal of the frequency of signals being compared in phase comparator 136.

The output frequency of voltage-controlled oscillator (VCO) 131 in the FDMA-TDD system of the present invention must have a minimum resolution and be carefully controlled, thereby placing limitations on the frequency of signals being compared in phase comparator 136.

In order to produce frequencies having a predetermined difference, the present invention uses first phase locked loop (PLL) 120 for frequency synthesis. First phase locked loop (PLL) 120, which generates a frequency that is not switched, is comprised of frequency dividers 121 and 125, phase comparator 122, low pass filter (LPF) 123, and voltage-controlled oscillator (VCO) 124.

In order to generate a frequency fh to be compared in phase comparator 136 of second phase locked loop (PLL) 130, an output of voltage-controlled oscillator 131 is transmitted through buffer 132 and is mixed with signals in mixer 133. The output of mixer 133 is then filtered in lowpass filter 134, amplified in amplifier 135, and provided to phase comparator 136 where its phase is compared with the phase of an output from first phase locked loop (PLL) 120. Accordingly, second phase locked loop (PLL) 130 is capable of being switched at a high speed.

When the frequency fh represents a desired channel difference, voltage-controlled oscillator 131 generates the transmission or receiving frequency with at least the same resolution as the single phase locked loop frequency synthesizer shown in FIG. 1. The frequency generated from voltage-controlled oscillator 131 is then provided to either first receiver mixer 6 or power amplifiers 400 and 401.

In order to generate the frequency fh, the frequency of the signal output from voltage-controlled oscillator 124 is synthesized with a desired resolution by first phase locked loop (PLL) 120.

For purposes of explanation, assume the following. A frequency generated by reference frequency quartz-crystal oscillator 51 is referred to as f1, frequency multiplier 52 multiplies frequencies by a factor of i, frequency multiplier 56 multiplies frequencies by a factor of m for transmission and by a factor of n for reception, and a radio carrier frequency generated by voltage-controlled oscillator (VCO) 131 for transmission is referred to as fc. A first local oscillation frequency generated for reception by voltage-controlled oscillator (VCO) 131 and provided to first receiver mixer 6 is referred to as f(LO1). A second local oscillation frequency provided to second intermediate frequency mixer 103 from frequency multiplier 112 is referred to as f(LO2). A frequency generated by receiver reference signal generator 111 is referred to as f2, while frequency multiplier 112 multiplies frequencies by a factor of W. The output frequency of voltage-controlled oscillator 124 and amplifier 135 is referred to as fh.

As stated above, voltage-controlled oscillator 131 in second phase locked loop (PLL) 130 is controlled to be oscillated to fc in the transmission mode and to f(LO1) in the receiving mode. The output frequency fh of voltage-controlled oscillator 124 and lowpass amplifier 135 is expressed as follows:

$$fh=fc-[(f1)(i)(m)] \text{ or } fh=[(f1)(i)(m)]-fc,$$

in the transmission mode $$fh=f(LO1)-[(f2)(W)(n)] \text{ or } fh=f(LO1)-[(f2)(W)(n)],$$

in the receiving mode

A first receiver intermediate frequency f(IF1)=fc−f(LO1) or f(IF1)=f(LO1)−fc, while a second receiver intermediate frequency f(IF2)=f(IF1)−f(LO2) or f(IF2)=f(LO2)−f(IF1) where f(LO2)=[(f2)(W)]. Exemplary values for these frequencies and factors are:

fc=864.150–868.050 MHz, (100 kHz steps)
f(LO1)=720.400–724.300 Mhz, (100 kHz steps)
f(LO2)=143.250 MHz
f(IF1)=143.750 MHz
f(IF2)=500 kHz
fh=4.150–8.050 MHz, (100 kHz steps)
f1=86.000 MHz
f2=71.625 MHz
i=2
W=2
m=5 (transmission mode)
n=5 (receiving mode)

Since frequency multiplier 56 includes and uses both multiplying factors n and m, there is no need for a switching operation. Switching circuit 54 is connected between band pass filter (BPF) and multiplier 56 in the transmission mode, and voltage-controlled oscillator 131 oscillates to a frequency band around fc. Switching circuit 54 is connected between amplifier 55 and multiplier 56 in the receiving mode, and voltage-controlled oscillator 131 is adjusted to oscillate to a frequency band around f(LOI).

According to the present invention, a heterodyne source in the transmission mode differs from the heterodyne source in the receiving mode, thereby fundamentally removing the problem of interference between the transmission and the reception modes. Frequency multiplier 56, buffer 132, and mixer 133 in which a high frequency of the heterodyne loop is inserted, serve to lower only the frequency fh, so that the present invention can reduce power consumption and be easily constructed.

The transmitting/receiving signal processing circuit constructed according to the principles of the present invention employs the heterodyne loop in order to improve power efficiency and solve the problem of frequency drifting. The heterodyne source from frequency discriminating demodulator 101 is applied in the receiving mode, and the heterodyne source from reference frequency quartz-crystal oscillator 51 is applied in the transmission mode, thereby enabling use of a single reference loop. Therefore, since there is no need to switch the reference loop itself, there is an advantage in that the problem of frequency drifting can be fundamentally removed. Also, the single reference loop does not generate intermodulation components, as compared to a plurality of reference loops.

In addition, the single reference loop is easily implemented by using a commercialized, off-the-shelf, component. Also, integration of the demodulator function and the single reference loop function into a single chip is not difficult since interference between the two loops is essentially removed, and all necessary frequencies can be produced with only reference frequency quartz-crystal oscillator 51 during the transmission mode. As a result, there is an advantage in that the frequency can be adjusted well. Generally, a frequency error of the transmitter can be limited by using corresponding standard regulations.

Finally, there is an advantage in that, since a single reference frequency synthesis loop for channel conversion is used, data inputs are simply and efficiently processed and channel conversion time can be reduced. Accordingly, power consumption during a standby for the receiving mode is reduced.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A transmitting/receiving signal processing circuit in a digital cordless communication device having transmitting means for transmitting first signals as radio waves via an antenna, and receiving means for receiving second signals from said antenna and providing said second signals to a user, in a time division communication system using a single frequency channel for a transmission mode and a receiving mode according to constant time periods, said circuit comprising:

a frequency synthesizer comprising:
first phase locked loop means for receiving a reference frequency signal and generating a first frequency signal in dependence upon said reference frequency signal;
switching means for providing a local oscillation signal derived from said receiving means as a heterodyning source in said receiving mode, and for providing said reference frequency signal multiplied by predetermined constants as said heterodyning source in said transmission mode; and
second phase locked loop means for generating a transmission frequency signal in dependence upon said reference frequency signal multiplied by said predetermined constants during said transmission mode, and for generating a receiving frequency signal in dependence upon said local oscillation signal derived from said receiving means during said receiving mode.

2. The transmitting/receiving signal processing circuit according to claim 1, wherein said first phase locked loop means provides said first frequency signal to said second phase locked loop means during said transmission mode and said receiving mode for generation of said transmission frequency signal and said receiving frequency signal, respectively.

3. The transmitting/receiving signal processing circuit according to claim 2, wherein a frequency of said first frequency signal is maintained constant between said transmission mode and said receiving mode.

4. A transmitting/receiving signal processing circuit in a digital cordless communication device having transmitting means for transmitting first signals as radio waves via an antenna, and receiving means for receiving second signals via said antenna and providing said second signals to a user in a time division communication system, said circuit comprising:

first phase locked loop means for receiving a reference frequency signal and providing a first frequency signal during both a transmission mode and a receiving mode in dependence upon said reference frequency signal; and second phase locked loop means for generating a transmission frequency signal in dependence upon said reference frequency signal and said first frequency signal during said transmission mode, and for generating a receiving frequency signal in dependence upon a local oscillation signal from said receiving means and said first frequency signal during said receiving mode.

5. The transmitting/receiving signal processing circuit according to claim 4, wherein a frequency of said first frequency signal is maintained constant between said transmission mode and said receiving mode.

6. A digital transmission and reception device, comprising:

means for generating a first reference frequency signal;
   means for generating a second reference frequency signal;
   a first phase locked loop for generating a first loop frequency signal in dependence upon said first reference frequency signal;
   switching means for providing said first reference frequency signal as a heterodyning source during a transmission mode of said device, and for providing said second reference frequency signal as said heterodyning source during a receiving mode of said device; and
   a second phase locked loop for generating a transmission frequency signal in dependence upon said first reference frequency signal and said first loop frequency signal during said transmission mode, and for generating a receiving frequency signal in dependence upon said second reference frequency signal and said first loop frequency signal during said receiving mode.

7. The device of claim 6, further comprising multiplying means interposed between said switching means and said second phase locked loop, for multiplying said first reference frequency signal by a first predetermined constant for said transmission mode, and for multiplying said second reference frequency signal by a second predetermined constant for said receiving mode.

8. The device of claim 6, wherein a frequency of said first loop frequency signal is maintained constant between said transmission mode and said receiving mode.

9. The device of claim 7, wherein a frequency of said first loop frequency signal is not altered between said transmission mode and said receiving mode.

10. The device of claim 6, wherein said second phase locked loop comprises:

means for mixing a second loop frequency signal representative of a frequency currently generated by said second phase locked loop with said first reference frequency signal during said transmission mode to generate a first mixed frequency signal, and for mixing said second loop frequency signal with said second reference frequency signal during said receiving mode to generate a second mixed frequency signal; and
    phase comparing means for comparing a phase of said first mixed frequency signal with a phase of said first loop frequency signal to enable generation of said transmission frequency signal during said transmission mode, and for comparing a phase of said second mixed frequency signal with said phase of said first loop frequency signal to enable generation of said receiving frequency signal during said receiving mode.

11. The device of claim 10, wherein a frequency of said first loop frequency signal is maintained constant during said transmission mode and said receiving mode.

12. A method for generating a transmission frequency signal and a receiving frequency signal during a transmission mode and a receiving mode, respectively, comprising the steps, of:

generating a first reference frequency signal;
    generating a second reference frequency signal;
    generating a first loop frequency signal by phase locking said first reference frequency signal;
    providing said first reference frequency signal as a heterodyning source during said transmission mode, and providing said second reference frequency signal as said heterodyning source during said receiving mode;
    mixing a second loop frequency signal with said first reference frequency signal to generate a first mixed signal for said transmission mode, and mixing said second loop frequency signal with said second reference frequency signal to generate a second mixed signal for said receiving mode; and
    generating said transmission frequency signal by comparing a phase of said first mixed signal with a phase of said first loop frequency signal during said transmission mode, and generating said receiving frequency signal by comparing a phase of said second mixed signal with said phase of said first loop frequency signal during said receiving mode.

13. The method of claim 12, wherein a frequency of said first loop frequency signal is maintained constant between said transmission mode and said receiving mode.

14. The method of claim 12, further comprising the steps of:

multiplying said first reference frequency signal by a first predetermined constant prior to providing said first reference frequency signal as said heterodyning source during said transmission mode; and
    multiplying said second reference frequency signal by a second predetermined constant prior to providing said second reference frequency signal as said heterodyning source during said receiving mode.

15. The method of claim 14, wherein a frequency of said first loop frequency signal is maintained constant between said transmission mode and said receiving mode.

16. A signal processing circuit, comprising:

a frequency synthesizer comprising:
       first phase locked loop means for receiving a reference frequency signal and generating a first frequency signal in dependence upon said reference frequency signal;
       switching means for providing a local oscillation signal as a heterodyning source in a receiving mode, and for providing said reference frequency signal multiplied by predetermined constants as said heterodyning source in a transmission mode; and
       second phase locked loop means for generating a transmission frequency signal in dependence upon said reference frequency signal multiplied by said predetermined constants during said transmission mode, and for generating a receiving frequency signal in dependence upon said local oscillation signal during said receiving mode.

17. The circuit of claim 16, wherein said first phase locked loop means provides said first frequency signal to said second phase locked loop means during said transmission mode and said receiving mode to enable generation of said transmission frequency signal and said receiving frequency signal, respectively.

18. The circuit of claim 17, wherein a frequency of said first frequency signal is maintained constant between said transmission mode and said receiving mode.

19. A signal processing circuit in a digital cordless communication device, said circuit comprising:

first phase locked loop means for receiving a reference frequency signal and providing a first frequency signal during both a transmission mode and a receiving mode in dependence upon said reference frequency signal; and second phase locked loop means for generating a transmission frequency signal in dependence upon said reference frequency signal and said first frequency signal during said transmission mode, and for generating a receiving frequency signal in dependence upon a local oscillation signal and said first frequency signal during said receiving mode.

20. The circuit of claim 19, wherein a frequency of said first frequency signal is not altered between said transmission mode and said receiving mode.

* * * * *